United States Patent [19]
Rinderle

[11] Patent Number: 4,761,828
[45] Date of Patent: Aug. 2, 1988

[54] RADIO RECEIVER

[75] Inventor: Heinz Rinderle, Heilbronn, Fed. Rep. of Germany

[73] Assignee: Telefunken electronic GmbH, Heilbronn, Fed. Rep. of Germany

[21] Appl. No.: 807,342

[22] Filed: Dec. 9, 1985

[30] Foreign Application Priority Data

Dec. 24, 1984 [DE] Fed. Rep. of Germany ....... 3447282

[51] Int. Cl.$^4$ ............................................. H04B 1/10
[52] U.S. Cl. .................................. 455/296; 455/302; 455/305
[58] Field of Search ............... 455/266, 249, 245, 251, 455/296, 295, 239, 241–243, 246, 247, 250, 284, 285, 200, 197, 302, 305

[56] References Cited

U.S. PATENT DOCUMENTS

| | | | |
|---|---|---|---|
| 3,622,887 | 11/1971 | Byles | 455/250 |
| 4,126,828 | 11/1978 | Kumagai | . |
| 4,172,239 | 10/1979 | Harford | 455/249 |
| 4,245,353 | 1/1981 | Bynum | 455/266 |
| 4,355,414 | 10/1982 | Inoue | 455/296 |
| 4,479,254 | 10/1984 | Craiglow | 455/247 |
| 4,580,288 | 4/1986 | Rinderle | 455/247 |
| 4,653,116 | 3/1987 | Lindenmeier et al. | 455/296 |

FOREIGN PATENT DOCUMENTS

| | | |
|---|---|---|
| 2550176 | 5/1976 | Fed. Rep. of Germany . |
| 2943375 | 5/1980 | Fed. Rep. of Germany . |
| 3005537 | 8/1981 | Fed. Rep. of Germany . |
| 3210454 | 9/1983 | Fed. Rep. of Germany . |
| 0168728 | 9/1984 | Japan ................................... 455/249 |

OTHER PUBLICATIONS

Meinke et al., Prof. Dr. E.h. H. H., "Störwirkung von Fremdsendern bei Autoradios" Funkschau (1978) pp. 86–90.

Primary Examiner—Michael A. Masinick
Assistant Examiner—Curtis Kuntz
Attorney, Agent, or Firm—Spencer & Frank

[57] ABSTRACT

In a radio receiver in which the received signal is converted by mixing into an intermediate frequency signal and/or a baseband signal, the degree of distortion of received disturbance signals in the receiver is temporarily changed and a recognition circuit is used which recognizes from the change in the signal gaining demodulation, caused by the change in the degree of distortion, whether the receiver is receiving spurious interference signals falling into the useful channel, and which, in the event of such a disturbance signal reception, initiates a suppression or reduction of the spurious interference signals.

25 Claims, 11 Drawing Sheets

RADIO RECEIVER

BACKGROUND OF THE INVENTION

The invention relates to a radio receiver in which the received signal is converted by mixing into an intermediate frequency signal and/or a baseband signal. As is well-known, the purpose of radio receivers is to receive electromagnetic waves. Radio receivers are, for example, radio broadcast receivers, television receivers or radiotelephones.

The problem that a signal spectrum whose spectral components may exhibit level differences of up to 120 dB must be processed by the receiver is known to occur in radio receivers. The high-level signal components mostly result in interfering disturbances such as, for example, multiple reception through harmonic mixing and intermodulation. Such disturbances are known to be caused by the signal-dependent driving of the non-linear components located in the signal path.

The intermodulation disturbances are particularly critical since they may already occur at a relatively low disturbance signal level. Intermodulation disturbances are disturbances which are caused by at least two disturbance signals and constitute a disturbance when the frequencies of, for example, two disturbance signals with the frequencies $f_{s1}$ and $f_{s2}$, respectively, have such a constellation in relation to each other that one of the two conditions $$2f_{s1} - f_{s2} = f_e \text{ or } 2f_{s2} - f_{s1} = f_e$$

is met, with $f_e$ being the frequency of the desired signal or the adjusted receiving frequency.

In this case, an "apparent" desired signal which—in the case of two disturbance signals—typically contains the modulation content of both disturbance signals, may be received on the desired frequency. Such a reception situation is then mostly interpreted by the user, for example, the radio broadcast listener, as lacking selectivity of the receiver. Another disturbing effect of the intermodulation is the interference formation with a weaker desired signal, which could be satisfactorily received, for example, without intermodulation or at low intermodulation. The danger of the disturbing effect of high-level signal components at the receiver input generally increases overproportionally with the number of high-level signal components and with their level. In most cases, intermodulation disturbances in a radio receiver are formed in the receiver stages before the channel selection, i.e., in the receiver prestage (RF) or in the mixing stage. Components which cause such disturbances are, for example, bipolar transistors, field-effect transistors and diodes; varactor diodes are also included in the intermodulation forming components.

Figure 1:
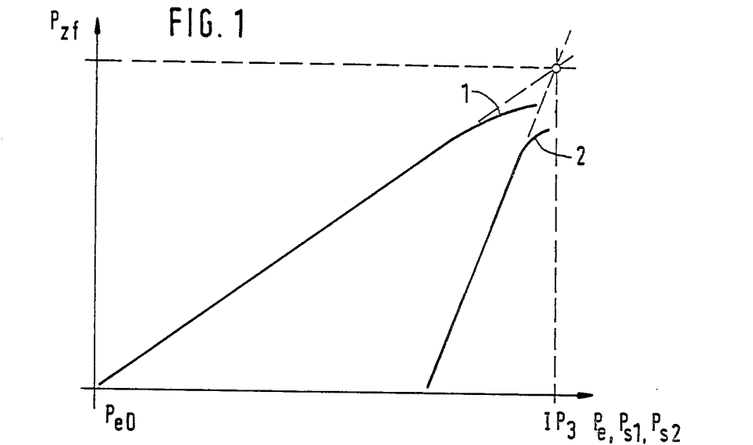
FIG. 1 shows the behavior between desired signal and interference signal.

In technical literature, the intermodulation behavior of a radio receiver is characterized by the so-called intercept point. It is the third order intercept point that is meant. The intercept point is apparent from the diagram of FIG. 1. Indicated in this diagram, on the abscissa axis are the level of the desired signal $P_e$ and also the level $P_{s1}$ and $P_{s2}$ of the two disturbance signals causing the intermodulation, and on the ordinate axis, as an example, the intermediate frequency signal level $P_{if}$ at the output of the receiver mixing stage. Curve 1 shows the output signal level $P_{if}$ in dependence upon the desired signal $P_e$. Curve 2 describes the dependency of the output level $P_{if}$ on disturbance signal levels $P_{s1}$ and $P_{s2}$, which cause the intermodulation (3rd order). In the illustration of the dependency it is assumed that both axes of FIG. 1 have logarithmic graduation, that the two disturbance signal levels are, furthermore, identical and that there is also no amplification control in the signal path. It is, furthermore, assumed that the level at which a signal/disturbance ratio of 30 dB occurs at the receiver output, in relation to a predetermined desired signal modulation, is regarded as the smallest desired signal level in the diagram (zero point of the abscissa axis). The point of interseption of the two curve tangents produces a fictitious point in the diagram, the so-called intercept point, which is assocaited with a certain input level, the fictitious level of the disturbance signals forming the intermodulation and a certain fictitious IF output level. The gradients of the two curve tangents typically differ by the factor 3. In radio receivers, the intercept point is generally indicated in relation to the receiver input level ($IP_3$).

A large level value of the intercept point is aimed at for a radio receiver. The larger this value is, the larger are the disturbance signal levels which the receiver can process without a disturbing effect through intermodulation. An increase in the intercept level of a receiver is, however, limited by economic considerations.

In order to reduce intermodulation disturbances or, more generally, interfering disturbances, it is known to control the amplification at the receiver input in dependence upon the input signal, for example, by controlling an amplification component or by controlling a damping member comprised, for example, of PIN diodes. In known radio receivers, the control signal controlling the amplification or damping is produced, for example, by rectification of the amplified intermediate frequency signal and/or by rectification of the signal before the channel selection, for example, via the output of the prestage or via the input or the output of the mixing stage.

The positive effect of such a control for decreasing interfering disturbances does, however, only occur when the component controlling the amplification or the damping is arranged before the receiver stage forming the interference, and the controlled component itself does not contribute towards the interference.

The disadvantage of the known radio receiver circuit, wherein the control signal is produced by rectification of the IF signal in the signal path of the receiving section, is that complete suppression of the demodulation of an interference signal is, in principle, not possible since the control signal required to suppress the interference cannot be produced in the control circuit by the interference signal itself. If an interference signal already produces an effective control signal, the interference signal is also demodulated and, therefore, causes a disturbance. In this case, the interfering disturbance can only be suppressed by a correspondingly strong desired signal. In a radio receiver of the described kind, the disturbance likelihood through interference may only be reduced by reducing the threshold level for signal gain/damping control.

This measure does, however, have the disadvantage that the maximum signal/noise ratio of a received desired signal that is attainable remains correspondingly low since for a desired signal, above the threshold level, the signal/noise ratio practically no longer increases with the desired signal level.

The disadvantage of the known radio receiver circuit, wherein the control signal is produced in broadband configuration by rectification of the signal before the IF selection, is that with the presence of high-level signals which are not desired signals and which produce correspondingly control signals, the entire signal composition, also the desired signals at the receiver input, are attenuated, and, more particularly, also when no disturbance would occur on account of the frequency constellation of the disturbance signals. Even one single strong disturbance signal which does not from an intermodulation product, impairs or thus stops reception of weaker desired signals.

SUMMARY OF THE INVENTION

The object of the invention is to provide a radio receiver, in particular, a radio broadcast receiver, which is capable of at least substantially suppressing interference disturbances, in particular, through intermodulation, and which, in contrast to known receivers, is neverthless still able to receive relatively weak signals.

In accordance with the invention, in a radio receiver, wherein the received signal is converted by mixing into an intermediate frequency signal and/or a baseband signal, the degree of distortion of received disturbance signals is temporarily changed in the receiver, and a recognition circuit is provided to recognize from the change in the signal to be demodulated, caused by the change in the degree of distortion, whether the receiver is receiving interfering disturbance signals falling into desired channel, and which, in the event of disturbance signal reception, initiates suppression or reduction of the interfering disturbance signals.

By "received disturbance signals" such signals are meant which are not desired signals, but which under certain conditions such as signal level and signal frequency, through non-linear distortions unavoidable in a receiver on account of non-linearities present in the signal path, form in the signal path of the receiver, interference signals which are demodulated and are, consequently, audible. They either disturb the desired reception of a desired signal or cause a disturbance, also without a desired signal. The degree of the non-linear distortions occurring unavoidably in the signal path is altered in accordance with the invention for recognition of the undesired interfering disturbances.

BRIEF DESCRIPTION OF THE DRAWINGS

The invention will now be described in greater detail, by way of examples, with reference to the drawings, in which.

The signal recognition principle unterlying the invention, i.e., the differentiation between desired signal and interference signal, in particular, intermodulation signals, is based on the fact that in the changing of the non-linearity in the transfer path of a signal spectrum, the interference signal changes to a relatively greater degree than the desired signal. This behavior was described in connection with FIG. 1. The same effect is obtained when instead of a change in the non-linearity of the transfer characteristic, the level of the signal spectrum is changed, and, more particularly, before the receiver stage forming the signal distortion. It is, therefore, a question of producing a varying distortion of the signal spectrum and of evaluating the result in the recognition circuit.

The temporarily varying distortion in the receiver, in accordance with the invention, is preferably produced by a pulse signal. The change in the signal distortion caused by the pulse signal may be so designed that in the presence of the pulse, either the signal distortion is increased or the signal distortion is decreased. An increase in the signal distortion may, for example, be attained by the negative feedback or the operating point of the preamplifier stage or of the mixer being switched over by means of the pulse signal or by components forming distortions being switched into the signal path by the pulse signal. A decrease in the signal distortion is, for example, attained by temporarily producing a signal damping before the receiver stage forming the undersired distortions by means of the pulse signal. Such a signal damping may, for example, be attained via a controlled PIN diode in the signal path. The use of PIN diodes for signal damping has the advantage that at higher signal frequencies—from approximately 10 MHz upwards—they themselves do not cause distortions.

In the receiver according to the invention, it is a question of differentiating from the temporary change in the signal distortion a desired signal from an interference signal and of producing therefrom a corresponding recognition signal. Such a differentiation is possible, for example, by evaluation of the output level of the signal rectifier. By means of this signal, an interference signal can then be suppressed or its disturbing effect decreased. An interfering disturbance may, for example, be suppressed by an interference signal occurring during the tuning of a receiver suppressing the audio-frequency output signal by means of the recognition signal which occurs. Such a suppression is possible via a so-called mute circuit which is frequently used in receivers to suppress tuning noises (between the transmitter channels). If automatic tuning which usually stops the transmitter finder upon occurrence of a received signal, is employed in a receiver, an inventive suppression of an interference signal in the receiving channel may be effected by the finder stop being cancelled by the recognition signal. Another form of suppressing or reducing interfering disturbances consists in effecting a signal attenuation in the signal path, upon recognition of the interfering disturbances, before the receiver stage causing the interfering disturbance. In this case, it is advantageous to use PIN diodes for the signal damping since they themselves, as mentioned above, do not cause any signal distortions at higher signal frequencies.

In accordance with the invention, the checking of the reception situation of a receiver may be carried out both by single pulses at longer time intervals or continuously by a pulse sequence. The latter is advantageous in changing reception situations, as is to be anticipated in mobile radio operation. In this case, it is expedient to keep the pulse duration low in relation to the time between two successive pulses so as to keep disturbances caused by the "Checking procedure" low. Less disturbing effects due to the checking procedure (pulse time) are to be expected if the temporary signal damping is employed instead of the temporary distortion increase for signal recognition. This is due to the fact that with signal damping, an increased interference signal does not occur during the pulse time, in contrast to use of the distortion increase. On the other hand, in the case of the temporary signal damping, the desired signal is also correspondingly weakened, so that also in the case of interference signals not being present, the desired signal exhibits a temporarily lower signal-to-noise ratio. This does, however, constitute a smaller disadvantage than the temporarily increased occurrence of interfering disturbances, as would be the case with the temporary distortion increase.

Figure 2:
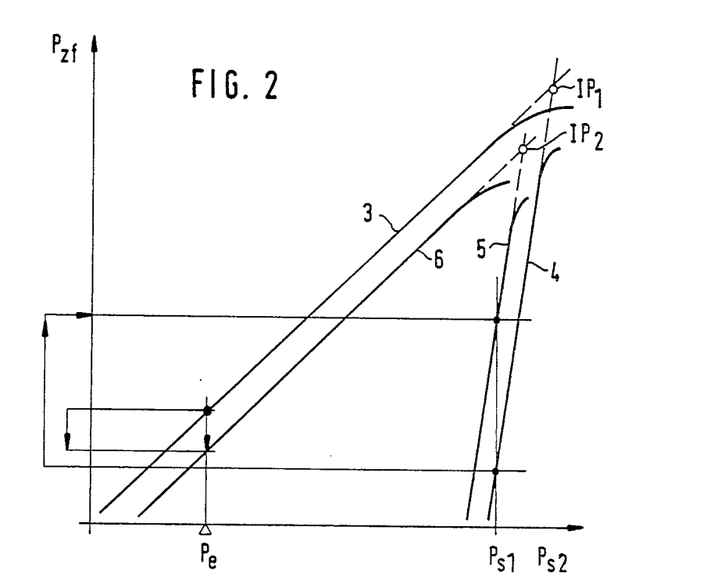
FIG. 2 shows the receiver behavior with respect to desired signal and disturbance signal level.

FIG. 2 shows the behavior of a receiver with respect to the desired signal and the intermodulation forming disturbance signal levels. The curves of FIG. 2 show the dependency of the IF level $P_{if}$ on the desired signal level $P_e$ and also on the disturbance signal level $P_{s1}$ and $P_{s2}$ in double-logarithmic representation. Curve 3 shows the dependency of the IF level on the desired signal level $P_e$ of the receiver. Curve 4 shows the dependency of the IF level caused by intermodulation on the disturbance signal level $P_{s1}$ and $P_{s2}$ (assumed equal in size). The points of intersection of the curves 3 and 4 form the intercept point of the receiver $IP_1$.

With the temporary increase of the signal distortion, in accordance with the invention, the receiver has, in accordance with the point of intersection of the tangents of the curves 5 and 6, temporarily a lower intercept point $IP_2$. This lower intercept point becomes effective during the pulse duration. Assuming constant signal levels ($P_e$, $P_{s1}$, $P_{s2}$), the IF output signal of the desired signal $P_e$ is lowered during the pulse duration and the intermediate-frequency interference product is enlarged.

A decrease in the intercept point during the pulse duration may, however, also be attained by the signal amplification being increased before the distortion forming stage or in the distortion forming stage itself, for example, by changing the operating point of the preamplifier transistor. In this case, an increase occurs instead of a reduction of the IF desired signal during the pulse duration. In comparison to this, there is a manifold increase in the IF disturbance signal level in the case of intermodulation disturbance. In each case, the intermediate-frequency interference signal is increased during the pulse time in relative comparison to the IF desired signal.

Figure 3:
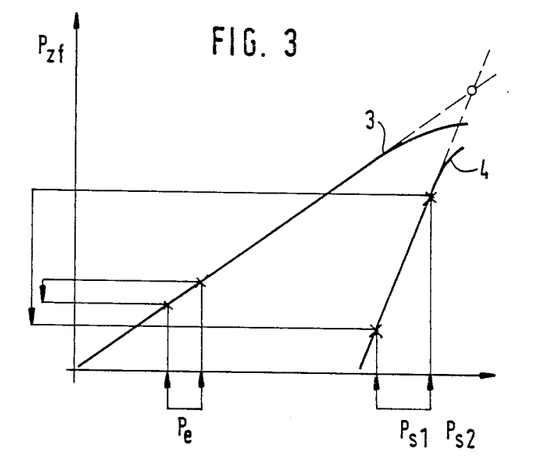
FIG. 3 shows the receiver behavior, in analogy with FIG. 2, but subject to the effect of a signal damping.

FIG. 3 shows, in analogy with FIG. 2, the behavior of the receiver when instead of the temporary increase of the signal distortion (lower level of the intercept point) there is a temporary signal damping, and, more particularly, with respect to the desired signal and also the disturbance signals before the distortion forming stage. In FIG. 3 it is, therefore, assumed that during the pulse time the desired signal $P_e$ and also the disturbance signal components $P_{s1}$ and $P_{s2}$ are lowered in the same ratio. This results in a decrease in the IF output level $P_{if}$, and, more particularly, such that there is a manifold decrease in the intermediate-frequency interference signal in relation to the IF desired signal. In the case of the disturbance caused by intermodulation, the relative change of the intermediate-frequency interference signal is three times larger than the relative change in the IF desired signal. In this case, it is assumed that there is no amplification change in the signal path by control during the pulse time.

Figure 4:
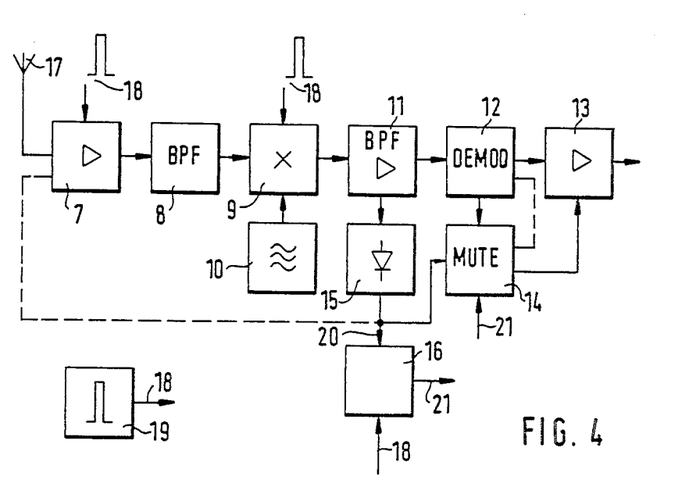
FIG. 4 shows a receiver in accordance with the invention.

FIG. 4 shows an inventive receiver which differs from the known receiver in that, in accordance with the invention, the degree of the signal distortion in the signal path is altered, and, more particularly, with the aid of a pulse signal 18. The inventive distortion change is effected by the pulse signal 18 correspondingly shifting, for example, the operating point of the prestage amplifier transistor and/or the operating point of the mixer and/or by switching into the signal path during the pulse duration a component causing a distortion. The pulse signal is generated, for example, by a pulse generator which is designated in FIG. 4 by the reference numeral 19.

The pulse generator 19 preferably generates a pulse sequence. The pulse width of the pulses corresponds to the time during which the inventive distortion takes place. The pulse duty factor, i.e., the ratio of the pulse duration to the time which lapses between the pulses, is preferably selected small (for example, smaller than 5%).

The inventive radio receiver of FIG. 4 comprises in addition to the preamplifier 7, the band-pass filter 8, the mixer 9, the local oscillator 10, the selective amplifier 11, the demodulator 12, the signal rectifier 15 and the pulse generator 19 which has just been described, a circuit component 16.

The task of the circuit component 16 is to evaluate the output signal 20 of the signal rectifier 15. It should differentiate between whether the received signal is a desired signal or a disturbing interference signal. The output signal 21 of the recognition circuit 16 receives the desired information. In the event that the output signal receives the information that there is a disturbance, the output signal 21 initiates, for example, a suppression of the output signal of the receiver, a finder start, a signal damping at the receiver input or an increase in the preselection. In the present case, the task of the mute circuit 14 is to suppress the output signal of the receiver. This happens, for example, by the low-frequency amplification of the low-frequency amplifier 13 or the output signal of the demodulator 12 being reduced.

Figure 5:
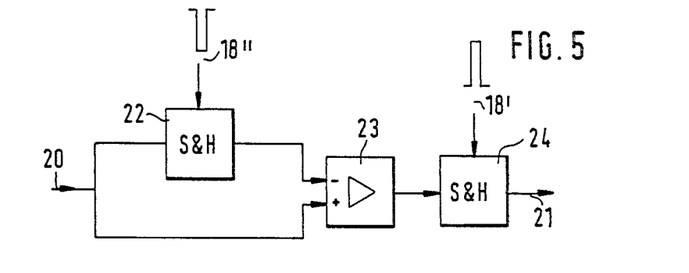
FIG. 5 shows an example for the recognition circuit.

FIG. 5 shows an embodiment for the recognition circuit. The recognition circuit of FIG. 5 consists of a first sample and hold circuit 22, a comparator 23 and a second sample and hold circuit 24. The two sample and hold circuits are fed sample pulses 18' and 18" inverted in relation to each other, which are derived from the pulse signal 18. The pulses of the pulse signals 18' and 18" are preferably narrower than the pulses of the pulse signal 18. The pulses of the signals 18' and 18" should appear at the same time as the pulses of the signal 18 which effects the change in the degree of distortion. To ensure this, the pulses of the signals 18' and 18" are preferably narrower than the pulses of the signal 18.

Figure 6:
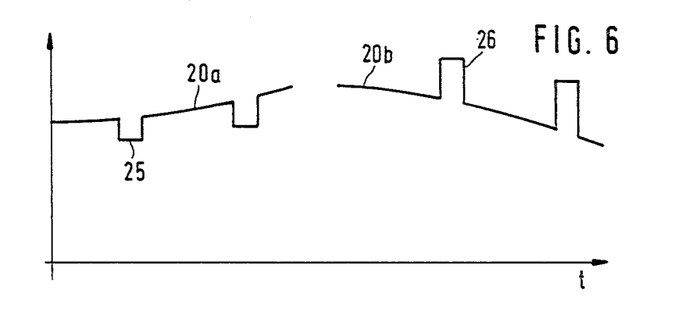
FIG. 6 shows the mode of operation of the recognition circuit.

The mode of operation of the recognition circuit is explained with reference to FIGS. 6 and 7. FIG. 6 shows the output signal 20 of the signal rectifier 15 in the event that a temporary distortion increase is employed.

The signal path 20a occurs, for example, when the receiver receives only a desired signal (without a disturbing interference signal). The pulse intrusion 25 is due to the fact that an amplification reduction takes place during the pulse duration of the signal 18.

The signal path 20b of FIG. 6 occurs, for example, when the receiver receives only a disturbing interference signal or when the disturbing interference signal is larger than a desired signal. A disturbing interference signal is known to mean an interference signal which falls into the IF-channel. The signal rise 26 is due to the fact that during the pulse duration of the signal 18 the interference signal occurs to a stronger degree on account of the higher distortion.

Figure 7:
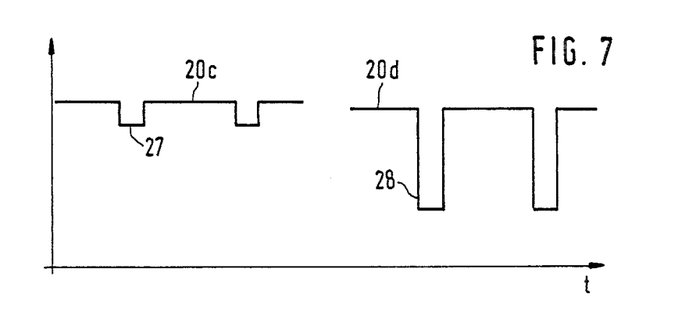
FIG. 7 likewise shows the mode of operation of the recognition circuit.

FIG. 7 shows the output signal 20 of the signal rectifier 15 in the event that a distortion decrease takes place. The signal path 20c occurs, for example, when the receiver receives only a desired signal (without a disturbing interference signal). The pulse intrusion 27 is due to the fact that an amplification reduction occurs during the pulse duration of the signal 18.

The signal path 20d occurs when the receiver receives only a disturbing interference signal or when the disturbing interference signal is larger than a desired signal. The intrusion 28 is due to the fact that the output signal of the signal rectifier 15 is correspondingly reduced by the decrease in the distortion of disturbing interference signals. The intrusion in the curve 20d is larger than in the curve 20c because the measure leading to the reduction of the distortion has a stronger influence on the disturbance than on the desired signal. The distortion is reduced, for example, by the signal at the receiver input being temporarily attenuated.

In addition to desired signals, an antenna is known to also receive disturbance signals which, however, only become noticeable when on account of non-linearities in the receiver, interference signals result therefrom, whose frequencies lie directly or on account of a mixing with the local oscillator signal in the frequency range of the IF channel or in the case of baseband mixing fall into the baseband. Such an interference signal therefore disturbs the desired channel at which the receiver is set. The frequency of the desired channel corresponds to the set receiving frequency. When disturbance signals or interference signals are referred to in this connection, it is, therefore, always disturbance signals which also become noticeable by falling into the desired channel that are meant.

The task of the sample and hold circuit 22 in FIG. 5 is to ascertain and store during the duration of the pulse 18 the value of the signal level 20 at the point in time shortly before occurrence of the pulse 18 which causes the distortion change in accordance with the invention. To this end, a pulse 18" inverted in relation to the pulse signal 18 is fed as sample pulse to the sample and hold circuit 22. The one input of the comparator circuit 23 is fed the stored signal of the sample and hold circuit and the other input is fed the signal 20 directly. During the pulse duration, the output of the comparator 23 delivers a signal whose size and polarity depend on which voltage and polarity are present at the comparator input during the pulse duration 18. On account of this mode of functioning, there occur, for example, positively directed output pulses at the output of the comparator 23 when the path of the signal 20 corresponds to the path 20a in FIG. 6. In analogy therewith, negatively directed output pulses occur when the signal path corresponds to the curve 20b in FIG. 6. The task of the second sample and hold circuit 24 is to transfer to the output and to store until the next pulse only the state (output voltage value) of comparator 24 existing during the pulse duration of the pulse 18. To this end, the sample and hold circuit 24 is fed the sample pulse 18.

If the circuit according to FIG. 5 is fed a signal 20 as described by the signal shape 20c and 20d, respectively. in FIG. 7, there would, with the described mode of functioning of the circuit be no possibility of differentiating between the two curve paths since in both cases the polarity of the potential difference at the comparator input during the pulse duration is the same, and, more particularly, such that the signal 21 is negatively directed in both cases at the output of the circuit. This disadvantage may, however, be eliminated if, for example, the signal value at the output of the sample and hold circuit 22 is reduced such that the resulting value which is fed to the comparator 23 lies between the pulse value 27 and 28. This may, for example, be attained by signal division at the input of the sample and hold circuit 22.

Another possibility of eliminating the disadvantage of the signal shapes 20c and 20d, respectively, with respect to their evaluatability, consists in altering the signal amplification, for example, in the IF section during the pulse duration 18 such that the attenuation of the output signal 20 during the pulse duration 18 is compensated or overcompensated by simultaneous amplification change in the opposite direction with respect to the output signal 20, so that in the case of the curve paths according to FIG. 7, the differentation between the two signal paths (20c and 20d) in a circuit according to FIG. 5 is possible.

Figure 8:
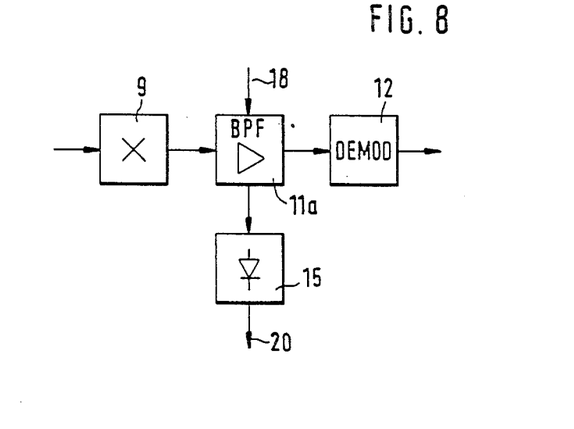
FIG. 8 shows a section of the circuit of FIG. 4.
Figure 9:
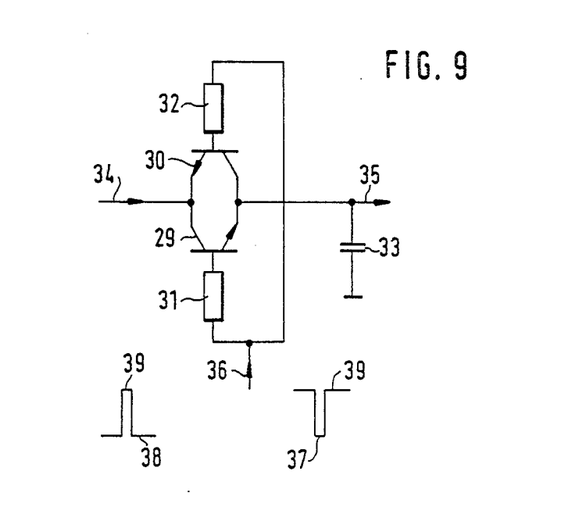
FIG. 9 shows a sample and hold circuit.

FIG. 8 shows a section of the inventive receiver circuit according to FIG. 4, wherein the selective amplifier 11a is fed the pulse signal 18 which changes the amplification of the signal at the point in time of the pulse duration such that the amplification change for the desired signal caused by the temporary distortion change, in relation to the output signal 20 of the signal rectifier 15, is compensated or overcompensated. The circuit according to FIG. 9 shows an embodiment of a sample and hold circuit. The embodiment according to FIG. 9 comprises the transistors 29 and 30, the resistors 31 and 32 and also a capacitor 33. The input signal is fed to the terminal 34 and the output signal is taken from the terminal 35. The sample pulse activating the sample and hold circuit is fed to the terminal 36. During the pulse duration, the transistors 31 and 32 are opened and the signal value present at this time at the terminal 34 is thereby transferred to the capacitor 33 acting as store. Assuming that the output terminal 35 is subjected to a low load by the following circuit, the charge on the capacitor 33 and thus the output voltage during the time up until the next sample pulse is practically maintained. If during the next sample pulse, the signal voltage at the terminal 34 during the pulse duration is a different one, the output potential of the terminal 35 changes accordingly and is, in turn, maintained until the next sample pulse. In the circuit according to FIG. 9, the sample phase occurs when the potential of the sample pulses 37, 38 exhibits the respectively higher positive value 39.

Figure 10:
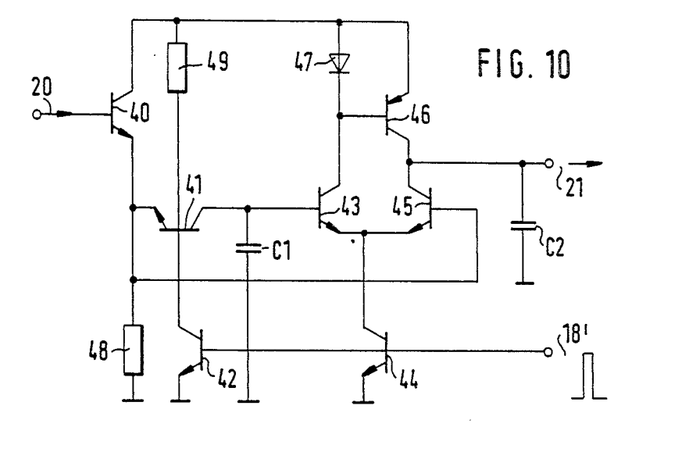
FIG. 10 shows a circuit according to FIG. 5.

FIG. 10 shows an embodiment of a circuit according to FIG. 5. This circuit comprises the transistors 40, 41, 42, 43, 44, 45, 46, the diode 47, the resistors 48 and 49 and the storage capacitors C1 and C2. This circuit is fed the signal 20 of the base of the transistor 40 which is to be evaluated. The signal path appearing at the emitter of the transistor 40 corresponding to the signal path of the signal 20 is fed to an input of the differential amplifier of a known kind, comprising the components 43, 44, 45, 46 and 47 directly and to the other input via the sample and hold circuit comprising the elements 41, 42, 49 and C1. The sample phase of the circuit is initiated via the sample pulse 18'. The differential amplifier of the circuit is activated via the transistor 44 only during the pulse duration (18'). In this time, the potential difference between the bases of the transistors 43 and 45 is measured and conducted as a corresponding current pulse (pulse duration corresponding to the length of time of the pulse 18') to the storage capacitor C2. In this way, the differential amplifier operates simultaneously as sample and hold circuit.

Figure 11:
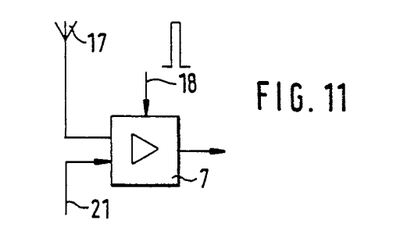
FIG. 11 shows a section of the circuit according to FIG. 4.

FIG. 11 shows a section of the circuit according to FIG. 4 with the receiver input state 7. In this embodiment of the invention, the output signal 21 is fed to the signal recognition circuit 16 as control signal for signal attenuation and/or increase of the preselection of the receiver input stage. This should have the effect of attenuating the disturbance signal level causing the interfering disturbance when an interference signal is received. Since, in accordance with the invention, the signal 21 acting as control signal only occurs when the desired channel is disturbed by an interference signal, a signal attenuation also only takes place under this precondition, whereas desired signals do not produce an control signal 21 and do, therefore, not cause a signal attenuation of the desired signal.

Figure 12:
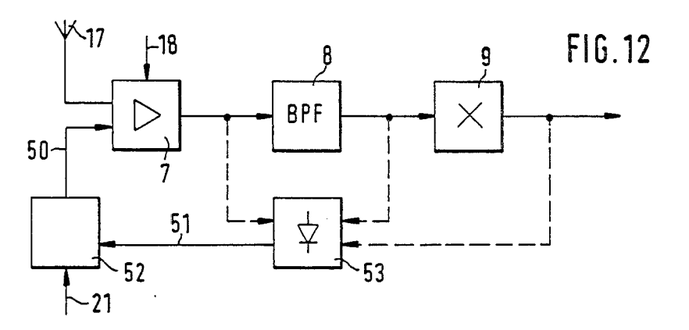
FIG. 12 shows part of the circuit according to FIG. 4.

FIG. 12 shows a circuit section of an inventive receiver circuit with the circuit components 7, 8 and 9 of the receiver circuit according to FIG. 4. The task of the circuit according to FIG. 12 is to effect attenuation of the desired and disturbance signals in the input stage 7 of the receiver by the control signal 50. In contrast to the circuit according to FIG. 11, it is not the control signal 21 which is fed to the input stage 7 in the circuit according to FIG. 12, but rather the control signal 50 which is produced by coupling the control signal 21 with a further control signal 51 in the coupling circuit 52. The second control signal 51 is formed in the rectifier circuit 53 by rectification of the signals occurring at the output of the input stage 7 or at the input and/or output of the mixing stage 9. The coupling of the two control signals 21 and 51 may be an additive or multiplicative one, which may, for example, be formed by an OR or AND function of the coupling circuit.

It may, however, be advantageous to effect an additional coupling with the output signal 20 of the signal rectifier 15 which, for example, causes, in general, a signal attenuation in the input stage from a certain desired signal level onwards.

Figure 13:
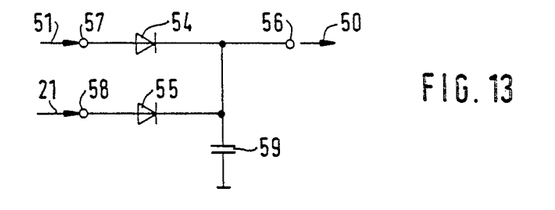
FIG. 13 shows a coupling circuit.

FIG. 13 shows the configuration of a coupling circuit 52. It comprises two diodes 54 and 55 which are connected to the output 56. The terminals 57 and 58 are fed the control signals 21 and 51. In this circuit design, the larger of the two input signals 21 and 51, respectively, determines the output signal 50. This circuit acts in combination with the capacitor 59 like a peak-detector with which the time for the charging procedure may be shorter than the discharge procedure.

Figure 14:
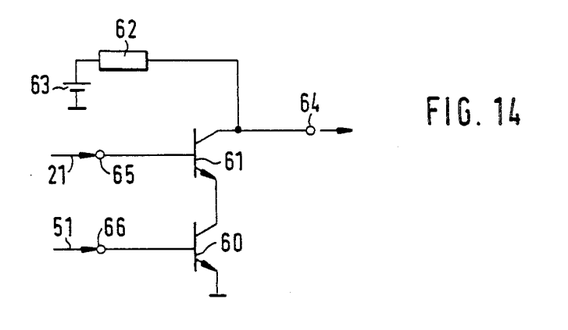
FIG. 14 likewise shows a coupling circuit.

FIG. 14 shows an embodiment of the coupling circuit 52 which effects a mulitplicative coupling of the two control signals 21 and 51. The circuit comprises the series-connected transistors 60 and 61 and the resisotr 62 which is connected between operating voltage source 63 and output terminal 64. The signals 21 and 51 to be coupled are fed to the input terminals 65 and 66. In the absence of a positive potential at the two input terminals at the same time, a collector current does not occur in the transistor 61 and the potential of the output terminal 64 corresponds to the voltage of the source 63. If, however, the potential of the base of the transistor 60 exceeds the threshold voltage and the potential of the base of the transistor 61 approximately twice the threshold voltage, then both transistors are opened and the potential of the output terminal is correspondingly reduced. In the circuit configuration according to FIG. 14, the control signal 51 determines the potential change at the output and thus the resulting control signal 50. The circuit according to FIG. 14 simultaneously inverts the signal path between input and output.

Figure 15:
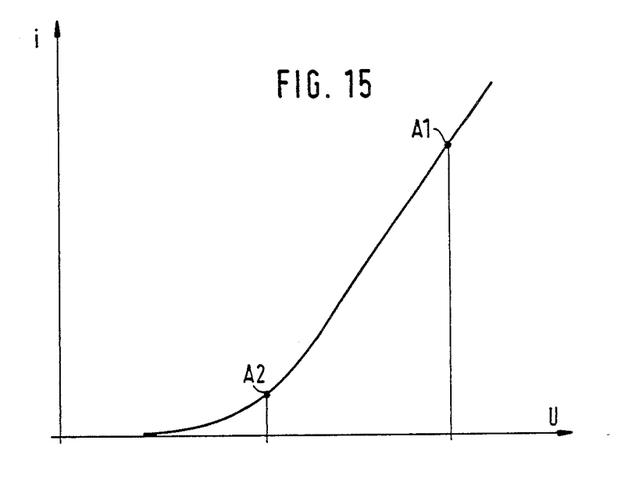
FIG. 15 shows the transfer characteristic of a transistor prestage.

FIG. 15 shows the transfer characteristics i (u) of a transistor prestage 7. This transfer characteristic illustrates the possibility of temporary distortion change by temporary switching-over of the operating point from A1 to A2. In the operating point A1, the signal distortion is lower than in the operating point A2 since A1 is located in the linearised characteristic section (for example, caused by negative feedback).

Figure 16:
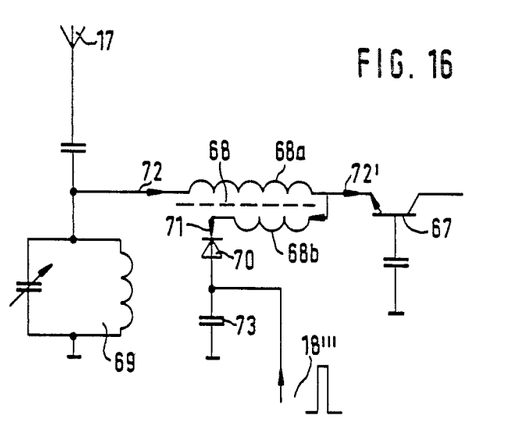
FIG. 16 shows a receiver input stage.

FIG. 16 shows a circuit of a receiver input stage which effects the temporary signal damping and thus the temporary reduction in the signal distortion during the pulse duration 18. The circuit according to FIG. 16 comprises the amplifier transistor 67 in common-base circuit which is coupled via the transformer network 68 to the tunable selection circuit 69. The signal damping is effected by the diode 70 (perferably a switching diode) which is made conductive by means of the pulse 18'''. The pulse 18''' is derived from the pulse 18. The signal damping effect is produced by the formation of a signal current 71, when the diode 70 is conductive, which is opposed to the signal current 72' and reduces it—assuming corresponding polarity of the windings 68a to 68b. The capacitor 73 constitutes a short circuit for the signal frequency.

Figure 17:
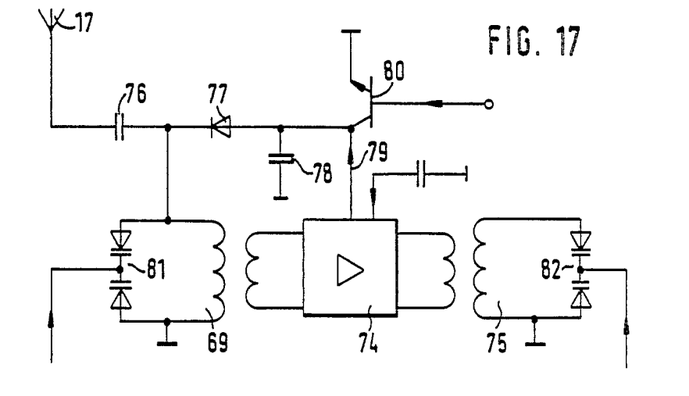
FIG. 17 shows a receiver prestage with a controllable signal attenuation.

FIG. 17 shows an embodiment of a receiver prestage with a controllable signal attenuation. The prestage of FIG. 17 comprises a tunable preselection circuit 69, an active amplifier 74 and a tunable output circuit 75. The antenna 17 is transformatically coupled via the capacitor 76 to the preselection circuit 69. The signal attenuation is carried out by a PIN diode 77 which as controllable alternating-current resistor is connected in parallel via the capacitor 78 to the preselection circuit 69. The current serving to control the PIN diode is derived from the operating current 79 of the stage 74. The transistor 80 which acts as controllable shunt resistor and is controlled by a control variable derived from the control signal 21 and 50, respectively, serves to control the current fed to the PIN diode 77. The tuning of the tuned circuits 69 and 75 is carried out by varactor diodes 81 and 82.

The circuit of FIG. 17 has the advantage that the entire receiver circuit is protected against disturbing interferences by the signal attenuation at the preselection circuit 69. The PIN diode has the advantage that it itself does not cause any distortions at higher frequencies. The circuit of FIG. 17 is particularly well suited for FM radio broadcast receivers.

Figure 18:
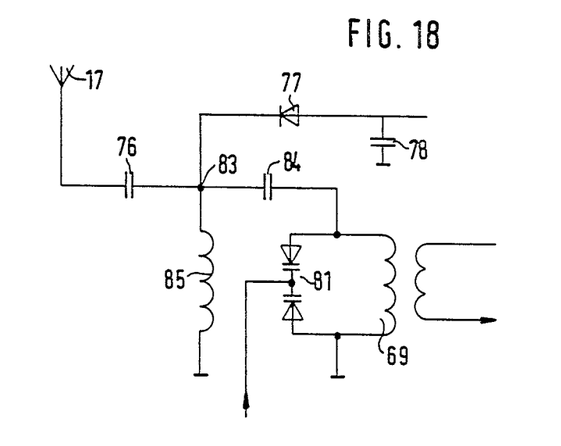
FIG. 18 likewise shows a receiver prestage.

The circuit of FIG. 18 differs from the arrangement of FIG. 17 in that PIN diode 77 acts on the circuit point 83. The transformation of the antenna resistance to the preselection circuit 69 is carried out via the circuit point 83. By means of the controllable PIN diode 77 the signal attenuation is controlled in such a way that the selectivity between antenna 17 and amplifier 74 increases with an increase in the signal attenuation. With the control of the signal attenuation, the transformation of the antenna resistance to the preselection circuit 69 is simultaneously controlled in such a way that the aforementioned selectivity increases with an increase in the signal attenuation.

The network provided for the transformation of the antenna resistance to the selection circuit 69 comprises the capacitors 83 and 84 and also the coil 85. The network has the characteristic that—in relation to the circuit point 68—the highest impedance occurs within the receiving band and that this impedance is substantially larger than the antenna resistance.

Figure 19:
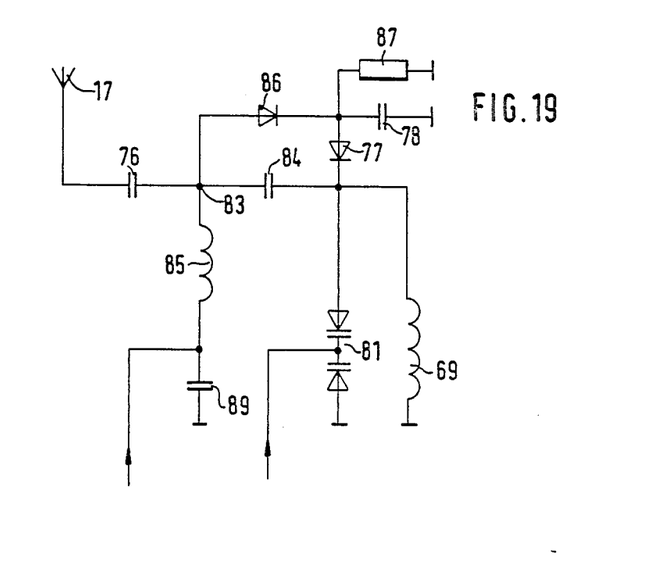
FIG. 19 shows the signal damping at the input of the receiver prestage.

FIG. 19 shows an embodiment of the signal damping at the input of the receiver prestage wherein a second PIN diode 86 is provided. The effect produced by the two PIN diodes is that the circuit of FIG. 19 exhibits a combination of the characteristics of the arrangements of FIGS. 18 and 19. The effect of the additional resistor 87 is that the signal damping is carried out by the PIN diode 77 at a higher level than the signal damping by the PIN diode 86. The control signal is fed to the connection point 88. The connection point 88 is grounded for the signal frequency by the capacitor 89.

Figure 20:
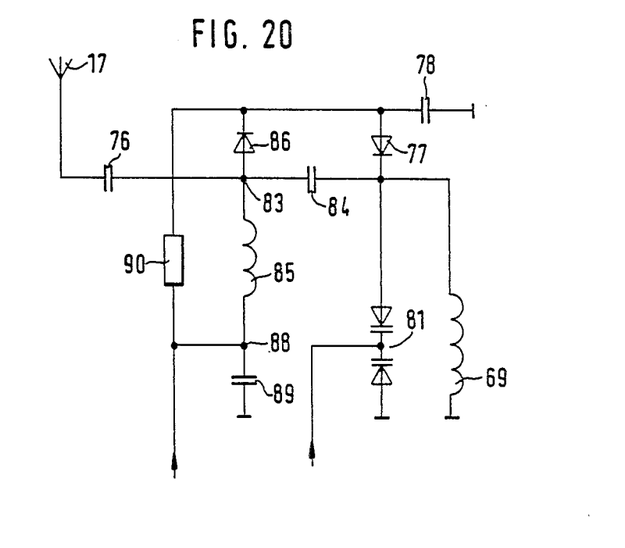
FIG. 20 likewise shows the signal damping at the input of the receiver prestage.

The circuit of FIG. 20 differs from the circuit of FIG. 19 in that the resistor 87 of the circuit of FIG. 19 is missing in it and instead of it the resistor 90 is provided between one end of the coil 85 and the cathode of the PIN diode 86. A reversal of the conditions is thereby attained, i.e., the signal damping by the PIN diode 86 starts at a higher level than the signal damping by the PIN diode 77.

Figure 21:
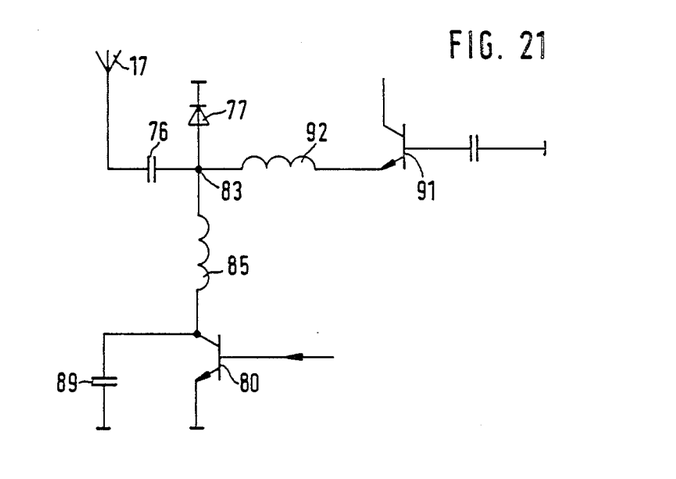
FIG. 21 shows the input circuit of a receiver prestage.

FIG. 21 shows the input circuit of a receiver prestage wherein a transistor 91 in common-base circuit is provided as amplifier transistor. The antenna 17 is coupled via a network to the emitter of the transistor 91. The network consists of the capacitor 76, the coil 85 and the coil 92. The network is so dimensioned that the largest impedance occurs at the midband frequency of the receiving band—in relation to the circuit point 83. The PIN diode 77 is arranged between the circuit point 83 and the reference point. The controlling of the PIN diode is carried out via the shunt transistor 80 by means of the signal which is derived from the control signal 21 and 50, respectively. The circuit of FIG. 21 constitutes a non-tunable broadband input circuit.

Figure 22:
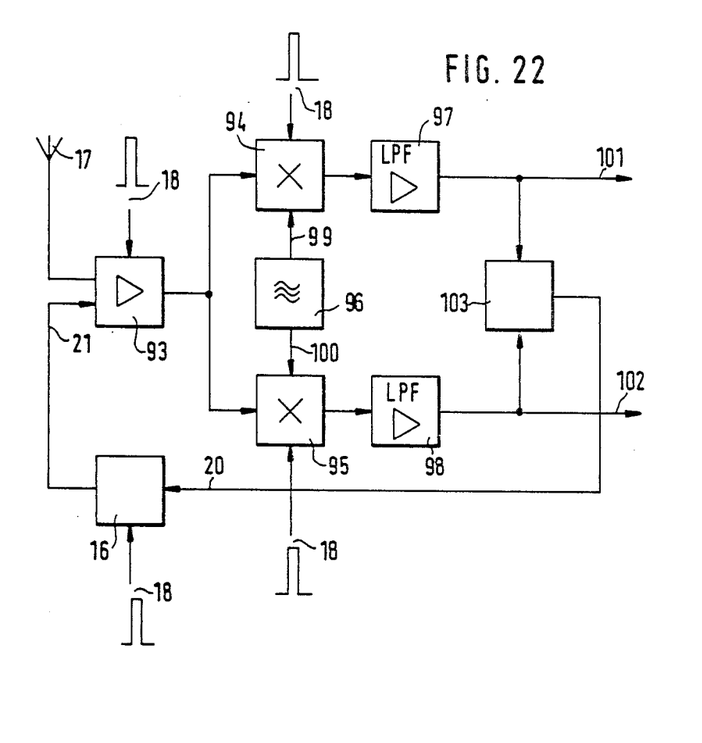
FIG. 22 shows an embodiment wherein the input signal is directly converted into a baseband signal.

FIG. 22 shows an embodiment of the invention wherein the input signal of the receiver is not converted into an intermediate frequency signal, but directly into a baseband signal. The receiving section consists of the input amplifier 93, the mixers 94 and 95, the oscillator component 96 and the active low-pass filters 97 and 98. The input amplifier 93 is preferably in the form of a tunable selective amplifier. The oscillator component 96 produces two signals 99 and 100 offset with respect to each other by 90°, which are fed to the mixers 94 and 95. In the case of a synchronous demodulation of the input signal, it is necessary to return the signal formed at the output of the amplifier 97 to the oscillator component 96 controllable in the frequency. The mixer 94, the active low-pass filter 97 and the controllable oscillator component 96 form a phase-control loop. It controls the synchronous demodulation of the receiving section. At the output of the active low-pass filter 97 there is thereby formed a low frequency signal 101 corresponding to the frequency modulation of the signal, while a signal quantity 102 corresponding to the amplitude of the signal is formed at the output of the active low-pass filter 98. The amplified input signal is fed to the mixers 94 and 95.

The inventive change in the signal distortion takes place in the signal path from the input to the output of the mixers 94 and 95. To obtain the control signal 20, the output signals 101 and 102 are coupled in the coupling circuit 103 and the output signal 20 of the coupling 103 is converted in the circuit section 16 into the control signal 21.

Figure 23:
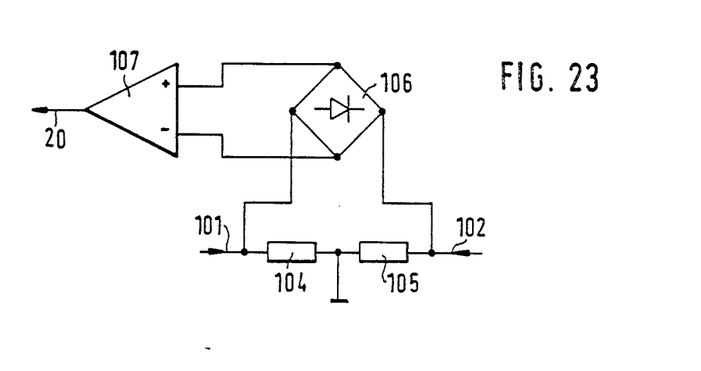
FIG. 23 shows a coupling circuit.

FIG. 23 shows an embodiment for the coupling circuit 103. The coupling circuit consists in the simplest form of an adding circuit with the resistors 104 and 105. The composite signal formed from the signals 101 and 102 is fed to a diode ring circuit 106 whose output signal is fed to the operational amplifier 107. The control signal 20 is proportional to the absolute value of the potential difference between the signal 101 and 102 and thus independent of the polarity of the potential difference. The circuit, therefore, produces the control signal 20 which corresponds to that of the amplitude of the received signal.

Figure 24:
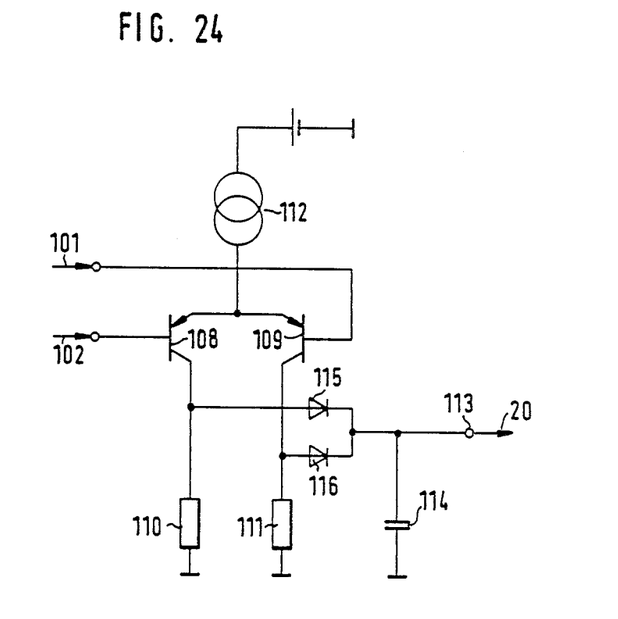
FIG. 24 shows a further coupling circuit.

FIG. 24 shows a further embodiment for the coupling circuit 103 in FIG. 22 which fulfills the same function as the circuit according to FIG. 23. The circuit according to FIG. 24 contains the transistors 108 and 109 which in combination with the resistors 110, 111 and the current source 112 operate as differential amplifiers. The signals 101 and 102 are fed to the bases of the transistors 108 and 109. The output signal is taken from the terminal 113.

The output signal is formed by charging the capacitor 114 to the respectively largest potential of the collectors of the transistors 108 and 109 in combination with the diodes 115 and 116. The output voltage is only dependent on the size of the potential difference between the two bases of the transistors 108 and 109 and not on their polarity.

The circuits according to FIG. 23 and FIG. 24 have the advantage that the signal 20 is already formed before the oscillator component is tuned to the received signal.

What is claimed is:

1. A radio receiver comprising:
    an input stage for receiving a radio signal composed of a desired signal in a first selected frequency range and an undesired disturbance signal;

a mixer connected to said input stage for converting the received radio signal into a lower frequency signal in a second selected frequency range lower than the first selected range;

signal distortion means connected in said receiver for imparting to the disturbance signal a distortion which temporarily changes in degree;

a recognition circuit connected to monitor the distorted disturbance signal, based on the change in the received signal due to the change in degree of distortion, for producing a recognition signal if the received signal contains a disturbance signal lying in the first selected frequency range; and signal modifying means connected to said recognition circuit and responsive to the recognition signal for initiating suppression or reduction of a disturbance signal lying in the first selected frequency range.

2. A radio receiver according to claim 1 further comprising means connected to said mixer for deriving a receiver output signal from the converted signal, and wherein said signal modifying means are operative for suppressing the receiver output signal.

3. A radio receiver according to claim 1 further comprising station finding means connected for varying the tuning frequency of said input stage in response to occurrence of the recognition signal.

4. A radio receiver according to claim 1 wherein the recognition signal acts to attenuate the received signal.

5. A radio receiver according to claim 1 wherein said input stage comprises means for effecting a preselection of the received signal and responsive to the recognition signal for increasing the preselection effected.

6. A radio receiver according to claim 1 wherein said input stage comprises a preamplifier and the change in degree of distortion takes place in one of said mixer and preamplifier.

7. A radio receiver according to claim 1 wherein said input stage comprises a preamplifier and a band-pass filter, and further comprising means connected for rectifying a signal derived from the output of one of said preamplifier, band-pass filter and mixer to produce a second signal.

8. A radio receiver according to claim 1 wherein said signal distortion means comprise at least one PIN diode.

9. A radio receiver according to claim 8 wherein said input stage comprises operating current supply means connected to supply control current to said PIN diode.

10. A radio receiver according to claim 1 wherein said distortion means operate to effect signal attenuation in said input stage.

11. A radio receiver according to claim 1 wherein the recognition circuit comprises a sample and hold circuit and a comparator.

12. A radio receiver according to claim 1, wherein the change in the degree of distortion takes place in the signal path between the input of the input stage and the output of the mixer.

13. A radio receiver according to claim 6, wherein the change in the degree of distortion is effected by correspondingly low negative signal feedback.

14. A radio receiver according to claim 6, wherein the change in the degree of distortion is effected by a corresponding operating point setting.

15. A radio receiver according to claim 6, wherein said signal means are connected to said one of the preamplifier and mixer.

16. A radio receiver according to claim 6, wherein said one of the mixer and preamplifier are designed to produce the desired distortion.

17. A radio receiver according to claim 7 further comprising a coupling circuit which couples the recognition signal and the second signal to produce an output signal which is fed to the input stage of the receiver.

18. A radio receiver according to claim 17, wherein the coupling circuit comprises an adder and a multiplier.

19. A radio receiver according to claim 1, wherein said input stage is frequency tunable.

20. A radio receiver according to claim 1 comprising a mute circuit to suppress the output signal in the event of disturbance.

21. A radio receiver according to claim 1 comprising a pulse generator for temporarily changing the degree of distortion.

22. A radio receiver according to claim 1, wherein the recognition circuit comprises two sample and hold circuits and a comparator.

23. A radio receiver according to claim 22 further comprising a signal rectifier providing a signal which is fed directly to one input of the comparator and to its other input via one sample and hold circuit, and the output signal of the comparator is fed to the other sample and hold circuit.

24. A radio receiver according to claim 20, wherein the comparator is in the form of a differential amplifier.

25. A radio receiver according to claim 4 comprising a transformer network to effect the temporary signal attenuation.

* * * * *